(12) United States Patent
Potocnik

(10) Patent No.: US 12,336,195 B2
(45) Date of Patent: Jun. 17, 2025

(54) TRENCH CAPACITOR DEVICE FOR SUPERCONDUCTING ELECTRONIC CIRCUIT AND SUPERCONDUCTING QUBIT DEVICE

(71) Applicant: IMEC VZW, Leuven (BE)

(72) Inventor: Anton Potocnik, Leuven (BE)

(73) Assignee: IMEC VZW, Leuven (BE)

( * ) Notice: Subject to any disclaimer, the term of this patent is extended or adjusted under 35 U.S.C. 154(b) by 507 days.

(21) Appl. No.: 17/682,587

(22) Filed: Feb. 28, 2022

(65) Prior Publication Data

US 2022/0285482 A1    Sep. 8, 2022

(30) Foreign Application Priority Data

Mar. 2, 2021 (EP) ..................... 21160148

(51) Int. Cl.
| | |
|---|---|
| H10D 64/60 | (2025.01) |
| G06N 10/00 | (2022.01) |
| H10D 1/00 | (2025.01) |
| H10D 1/68 | (2025.01) |
| H10N 60/80 | (2023.01) |

(Continued)

(52) U.S. Cl.
CPC ............ *H10D 1/042* (2025.01); *G06N 10/00* (2019.01); *H10D 1/716* (2025.01); *H10N 60/805* (2023.02); *H10N 69/00* (2023.02); *H01L 23/49888* (2013.01); *H01L 23/53285* (2013.01); *H10D 64/608* (2025.01); *H10N 60/12* (2023.02)

(58) Field of Classification Search
CPC ............... H01L 28/90; H01L 23/49888; H01L 23/53285; H01L 29/437; G06N 10/00; H10N 60/805; H10N 60/80; H10N 60/12; H10N 69/00; H03K 19/195; H01G 4/005; H10D 1/716; H10D 64/608
See application file for complete search history.

(56) References Cited

U.S. PATENT DOCUMENTS

| | | | | |
|---|---|---|---|---|
| 5,965,494 | A | * 10/1999 | Terashima | H01P 7/088 |
| | | | | 505/700 |
| 6,570,210 | B1 | * 5/2003 | Sowlati | H01L 28/82 |
| | | | | 257/532 |

(Continued)

FOREIGN PATENT DOCUMENTS

| | | |
|---|---|---|
| WO | 2019117972 A1 | 6/2019 |
| WO | 2019117973 A1 | 6/2019 |
| WO | 2019117974 A1 | 6/2019 |

OTHER PUBLICATIONS

Extended European Search Report and Written Opinion, Application No. EP21160148.9, mailed Aug. 31, 2021, 6 pages.

(Continued)

*Primary Examiner* — Ida M Soward
(74) *Attorney, Agent, or Firm* — McDonnell Boehnen Hulbert & Berghoff LLP

(57) ABSTRACT

The disclosure relates to a trench capacitor device for a superconducting electronic circuit. The trench capacitor device includes a substrate, a first capacitor electrode, and a second capacitor electrode, each electrode including a superconductor and extending into the substrate. The first electrode is circumferentially enclosed by the second electrode such that an inwardly facing surface of the second electrode faces an outwardly facing surface of the first electrode.

17 Claims, 3 Drawing Sheets

(51) Int. Cl.
*H10N 69/00* (2023.01)
*H01L 23/498* (2006.01)
*H01L 23/532* (2006.01)
*H10N 60/12* (2023.01)

(56) References Cited

U.S. PATENT DOCUMENTS

| | | | | |
|---|---|---|---|---|
| 7,437,187 | B1* | 10/2008 | Ye | H01P 7/082 |
| | | | | 333/204 |
| 10,068,184 | B1* | 9/2018 | Hertzberg | H10N 69/00 |
| 10,256,392 | B1 | 4/2019 | Brink et al. | |
| 2002/0047154 | A1* | 4/2002 | Sowlati | H01L 27/0805 |
| | | | | 257/E21.018 |
| 2003/0052682 | A1* | 3/2003 | Withers | G01R 33/34061 |
| | | | | 324/322 |
| 2009/0302279 | A1* | 12/2009 | Veciana Miro | H10K 71/60 |
| | | | | 252/500 |
| 2013/0029848 | A1* | 1/2013 | Gonzalez | H01P 3/003 |
| | | | | 438/665 |
| 2013/0161792 | A1* | 6/2013 | Tran | H01L 29/92 |
| | | | | 438/386 |
| 2013/0221483 | A1* | 8/2013 | Popp | H01L 27/0805 |
| | | | | 257/532 |
| 2014/0246652 | A1* | 9/2014 | Abraham | H01L 28/82 |
| | | | | 257/31 |
| 2016/0276570 | A1* | 9/2016 | Chang | H10N 60/805 |
| 2016/0364653 | A1 | 12/2016 | Chow et al. | |
| 2019/0043919 | A1 | 2/2019 | George et al. | |
| 2019/0165237 | A1 | 5/2019 | Hertzberg et al. | |
| 2019/0288176 | A1* | 9/2019 | Yoscovits | G06N 10/00 |
| 2019/0305037 | A1* | 10/2019 | Michalak | H10N 60/0241 |
| 2020/0091867 | A1* | 3/2020 | Goto | H03B 15/003 |
| 2020/0194856 | A1* | 6/2020 | Sekiya | H01P 7/105 |
| 2020/0333179 | A1* | 10/2020 | Chung | G01J 1/0425 |
| 2020/0403138 | A1* | 12/2020 | Chow | H10N 60/815 |
| 2023/0067888 | A1* | 3/2023 | Sundaram | H01G 9/0032 |

OTHER PUBLICATIONS

Gambetta, Jay M., Jerry M. Chow, and Matthias Steffen. "Building logical qubits in a superconducting quantum computing system." npj Quantum Information 3, No. 1 (2017): 1-7.

Oliver, William D., and Paul B. Welander. "Materials in superconducting quantum bits." MRS bulletin 38, No. 10 (2013): 816-825.

* cited by examiner

TRENCH CAPACITOR DEVICE FOR SUPERCONDUCTING ELECTRONIC CIRCUIT AND SUPERCONDUCTING QUBIT DEVICE

CROSS-REFERENCE TO RELATED APPLICATIONS

The present application is a non-provisional patent application claiming priority to European Patent Application No. 21160148.9, filed on Mar. 2, 2021, the contents of which are hereby incorporated by reference.

FIELD OF THE DISCLOSURE

The present disclosure relates to a trench capacitor device for a superconducting electronic circuit and a superconducting qubit device.

BACKGROUND

Superconducting quantum-bits (qubits) represent one of the most promising platforms for building a large-scale quantum computer. The promise of superconducting qubits can be attributed to the advances in high-performance microwave instrumentation developed, for the telecommunication industry, established fabrication techniques for microelectronic integrated circuits, and reduced sensitivity to atomic defects owing to the macroscopic quantum effects. Due to these advantages, superconducting qubit coherence times experienced an exponential increase over the last two decades, resembling Moore's law for electronic integrated circuits.

A superconducting qubit device structure may comprise a capacitor and a Josephson junction providing the function of a non-linear inductor, A Josephson junction may be formed by two superconductors separated by a thin (e.g. 1-2 nm) oxide tunneling barrier, which results in a nonlinear voltage-current relation and exhibits minimal (ideally zero) dissipation. To avoid ohmic losses in the conducting parts of the qubit device, peripheral circuitry are made of superconducting material, such as Nb or Al. The Josephson junction allows for defining qubits as nonlinear resonators with a finite anharmonicity $\alpha$ being equal to the energy difference between ground to the first excited state and first to second excited state energy splitting. The anharmonicity parameter $\alpha$ (e.g. approximately 300 MHz) may be engineered to be considerably larger than the qubit decoherence rate/spectral linewidth (<0.1 MHz), allowing single energy level excitation with high fidelity.

Useful quantum computers will consist of thousands if not millions of qubits with very long coherence times or extremely low microwave losses. The state-of-the-art quantum computers based on superconducting qubits contain nearly 100 qubits with coherence times of up to ~100 us. To achieve such large coherence times the size of qubits has seen a drastic increase in the last decade reaching almost 1 mm in lateral dimension. The large size of state-of-the-art qubits is an obstacle to scale them to millions on a chip as would be required for building useful quantum computers.

Qubit coherence times are limited by microwave losses at low power and low temperature regime. These predominantly come from oxides and other amorphous interfaces around the qubit device structure. The main source of microwave losses are so called two-level-system (TLS) defects that couple to the qubit via the electric field. TLS defects can be found in amorphous regions. Since the electric field tends to couple strongest to TLS in the capacitor, increasing the capacitor size allows reducing the electric field density and therefore reducing the energy loss through TLSs. A capacitor of a state-of-the-art qubit device may have a planar design composed of one or two superconducting planar electrodes surrounded by a planar ground plane. This relatively simple design is successful due to its simple fabrication process that allows careful post-processing of metal-air and substrate-air interfaces. Nevertheless, planar design requires capacitors to be much larger than other designs such as parallel-plate capacitors.

SUMMARY

In light of the above, it is a potential benefit of the disclosure to provide a trench capacitor device suitable for use in a superconducting electronic circuit, e.g. by forming part of a superconducting qubit device, and with a design potentially enabling a reduced footprint. It is a further potential benefit of the disclosure to provide a superconducting qubit device comprising such a trench capacitor device to potentially enable a superconducting qubit device with a reduced footprint. It is a further potential benefit of the disclosure to enable a reduced footprint while maintaining low microwave loss at the device interfaces.

In accordance with an aspect of the disclosure there is provided a trench capacitor device for a superconducting electronic circuit, comprising:
  a substrate; and
  a first capacitor electrode and a second capacitor electrode, each a superconductor and extending into the substrate, the first electrode being circumferentially enclosed by the second electrode such that an inwardly facing surface of the second electrode faces an outwardly facing surface of the first electrode.

The trench capacitor device can enable a vertical capacitor design (i.e. with respect to the substrate) potentially enabling a reduced footprint capacitor suitable for a superconducting electronic circuit, such as a superconducting qubit device. By the first and second capacitor electrodes (hereinafter for brevity referred to as first and second electrodes) extending into the substrate and being arranged such that the first electrode is circumferentially enclosed by the second electrode, a vertical dimension ay be employed to allow for an increased electrode area with a reduced impact on a footprint.

By the first and second electrodes being arranged such that the first electrode is circumferentially enclosed by the second electrode (i.e. such that the second electrode surrounds the first electrode) an electrical field may be localized between the electrodes, i.e. inside the second (outer) electrode, thus limiting stray electric field lines outside the trench capacitor electrodes. This in turn can enable reduce crosstalk between adjacent circuitry, such as adjacent superconductive qubit devices, facilitating realization of high density circuitry.

As will be further described herein, such an electrode configuration may be fabricated by forming the first and second electrodes in respective trenches etched in the substrate. The design of the trench capacitor hence can enable cleaning and/or smoothing of trench sidewall surfaces to remove oxides prior to electrode superconductor deposition. Presence of amorphous materials at the superconductor-dielectric interface of the trench capacitor device may hence be reduced.

By the first and second electrodes extending into the substrate, it can be meant that the electrodes extend into a thickness portion of the substrate. The first and second electrodes may accordingly be embedded in the substrate.

The first electrode may be arranged in a first trench in the substrate and the second electrode may be arranged in a second trench in the substrate, the first trench being circumferentially enclosed by the second trench.

A superconductor can mean any material exhibiting superconductivity below a critical temperature (e.g. a vanishing resistance).

The trench capacitor device can be suitable for use as a capacitor in a superconducting qubit device. Superconducting qubit device can mean a combination of a capacitor (e.g. the trench capacitor device) and one or more Josephson junctions connected between the capacitor electrodes. The Josephson junction may form a non-linear inductor of the qubit device.

A Josephson junction (JJ) may comprise a stack of two electrode layers of a superconductor (e.g. the same as or different from the superconductor of the electrodes of the capacitor) separated by an insulating tunneling barrier layer.

The trench capacitor electrodes may be formed with a width to height ratio of at least 1:10, "Width" can refer to the horizontal dimension (along the plane of the substrate) of the second electrode, while "height" can refer to the vertical distance (along the normal direction of the substrate) between a top-most portion and a bottom-most portion of the capacitor electrodes. This can enable a capacitor with a large electrode surface area and limited footprint on the substrate.

According to embodiments, the inwardly facing surface of the second electrode and the outwardly facing surface of the first electrode may be separated by a dielectric material of the substrate, or by an air gap or vacuum. In the case of a dielectric substrate material, the dielectric material may be "an ultra-low loss dielectric" (i.e. a dielectric with a loss tangent $\tan \delta \leq 10^{-6}$). The first and second electrodes may thus be separated by an ultra-low loss dielectric.

According to embodiments, the substrate may be a crystalline silicon substrate, wherein the first and second electrodes may be separated by crystalline silicon. A crystalline silicon substrate allows the capacitor electrodes to be separated by crystalline silicon. An electrode-dielectric interface of the trench capacitor device may hence be formed as a superconductor-crystalline silicon interface. A crystalline silicon substrate may be realized as a high-resistivity substrate. For example, the crystalline silicon substrate may have a resistivity of 1 k$\Omega$·cm or greater, for example 3 k$\Omega$·cm or greater. A high-resistivity implies a low amount of defects in the silicon such that the silicon may form an ultra-low loss dielectric between the electrodes.

State of the art techniques for precise etching of trenches with high-aspect-ratio in silicon are available (e.g. reactive-ion etching (RIE)), facilitating forming of a trench capacitor with well-controlled dimensions. Use of a silicon substrate further makes available state of the art processing techniques from CMOS technology, allowing high density circuitry fabrication, and forming of multilayer structures within tight tolerances.

According to embodiments, the first electrode may have a rounded cross-sectional shape (as seen in a plane parallel to the substrate) and the second electrode may have a rounded tubular cross-sectional shape as seen in a plane parallel to the substrate). Electrodes with rounded shapes may reduce peak electric field strength at the electrode-dielectric interfaces and with that reduce coupling to TLSs and increase coherence times. The first electrode may have a circular cross-sectional shape and the second electrode may have a hollow circular tubular cross-sectional shape. This may minimize the presence of sharp edges.

The first and second electrodes may be coaxially arranged. This can enable a symmetrical arrangement of the first and second electrodes, which together with a rounded shape may result in reducing electric field strength at the electrode interfaces and confining the electric field strength inside the capacitor electrodes.

According to embodiments, the cross-sectional shape of the first electrode may present a decreasing radial dimension along a direction from a first side of the substrate towards a second side of the substrate, and the tubular cross-sectional shape of the second electrode may present a decreasing wall thickness along a direction from the second side towards the first side of the substrate. In other words, the first electrode has a radial dimension decreasing with increasing depth into the substrate (as seen from the first side) and the second electrode has a wall thickness decreasing with increasing depth into the substrate (as seen from the second side).

Forming high-aspect ratio structures may result in sidewalk deviating from a strictly vertical orientation. For example, deep-etched trenches may typically be tapered. Forming the electrodes to be tapered along opposite directions (first-to-second side and second-to-first side respectively), can enable compensation of these process characteristics such that the capacitor footprint may be further reduced.

According to embodiments, the first electrode ma be arranged in a first trench extending into the substrate from a first side towards a second side of the substrate, and the second electrode may be arranged in a second trench extending into the substrate from the second side towards the first side. This may facilitate fabrication by allowing the first and second electrodes to be separately processed from different sides of the substrate. This configuration may further facilitate individually contacting of the first and second electrodes.

The first trench may be circumferentially enclosed by the second trench.

The first and second trench may be coaxially arranged with respect to each other.

The first trench may present a tapering along, a direction from the first towards the second side of the substrate such that a first trench width decreases with increasing depth of the first trench. The second trench may present a tapering along a direction from the second side towards the first side of the substrate such that a second trench width decreases with increasing depth of the second trench.

The first electrode may extend from a first superconductor layer arranged on the first side of the substrate towards the second side of the substrate, and the second electrode may extend from a second superconductor layer arranged on the second side of the substrate towards the first side. The electrodes may hence be connected to peripheral circuitry while the opposite side-arrangement of the electrodes and the respective superconductor layers may facilitate signal routing and layout. The first and/or second superconductor layer may form a ground plane of the trench capacitor device.

According to a further aspect there is provided a superconducting qubit device comprising:
- a trench capacitor device as set out above, and
- a Josephson junction (JJ) connected between the first electrode and the second electrode of the trench capacitor device.

This can help realize a reduced footprint superconducting qubit device, with the additional potential advantages associated with the trench capacitor device discussed above.

According to embodiments, the qubit device may further comprise a first ground plane arranged on a first side of the substrate and a second ground plane arranged on a second side of the substrate, wherein a lower electrode layer of the JJ may abut the first ground plane, the second electrode of the trench capacitor device may abut the second ground plane, and the first electrode may be connected to an upper electrode layer of the JJ.

The JJ may hence be formed on top of the first ground plane. In addition to facilitating fabrication of the JJ (e.g. by depositing and patterning a layer stack on top of the first ground plane), this configuration can enable an improved area efficiency. As a footprint of a JJ typically may be considerably smaller than a footprint of the second (outer) electrode of the trench capacitor, the JJ may be at least partly accommodated within the footprint of the second electrode. A parallel connection of the JJ and the trench capacitor device may further be accomplished by simply interconnecting the first and second ground planes.

The second electrode may comprise a (first) portion extending completely through the substrate to abut the first ground plane. The first and second ground planes may hence be interconnected, without addition of further conductive structures. This configuration can further enable around currents to be closed in close proximity to the capacitor electrodes.

Additionally or alternatively, the qubit device ma further comprise a via of a superconductor arranged to extend through the substrate to interconnect the first and second ground planes. If supplementing a ground-plane interconnection provided by the (first) portion of the second electrode, a via may further contribute to an equal ground potential of the two ground planes. If used instead of a ground-plane interconnection provided by the (first) portion of the second electrode, fabrication of the trench capacitor may be facilitated as the second electrode/trench may be formed with a uniform height along its circumference.

According to embodiments, the qubit device may further comprise a feedline arranged on the first side and capacitively coupled to the trench capacitor device, more specifically (at least) the first electrode. The feedline may extend to overlie a second portion of the second electrode. This may facilitate obtaining a sufficient capacitive coupling between the feedline and the first trench capacitor electrode without any appreciable area penalty.

According to a further aspect there is provided an array of qubit devices, each qubit device in accordance with the above, comprising a first and a second ground plane arranged on opposite sides of the substrate, wherein the Josephson junction of each qubit device is arranged on the first ground plane and the second electrode of the trench capacitor device of each qubit device abuts the second ground plane. As may be understood from the above discussion, this can enable an area-efficient, scalable, and uniform array of superconducting qubit devices.

According to a further aspect there is provided a method for forming a trench capacitor device for a superconducting electronic circuit, the method comprising:

forming in a substrate of silicon a first trench and a second trench, such that first trench is circumferentially enclosed by the second trench; and depositing a superconductor to form a first electrode of the trench capacitor device in the first trench and a second electrode of the trench capacitor device in the second trench, the first electrode being circumferentially enclosed by the second electrode such that an inwardly facing surface of the second electrode faces an outwardly facing surface of the first electrode.

A trench capacitor device suitable for a superconducting electronic circuit, e.g. a superconducting qubit device may hence be fabricated on a substrate of crystalline silicon (e.g. high-resistance/ultra-low loss substrate) using a combination of trench etches and superconductor deposition steps. As mentioned above, the trench sidewall surfaces are readily accessible for cleaning and/or smoothing. Hence, the method may further comprise applying a cleaning and/or smoothing step (e.g. using a wet etch) to sidewall surfaces of the first trench and the second trench prior to the respective deposition of the superconductor therein. Oxides may hence be removed prior to electrode superconductor deposition, wherein presence of amorphous materials at the electrode-dielectric interface of the trench capacitor electrodes may be reduced.

The method may further comprise depositing a barrier material on the sidewall surfaces of the first trench prior to depositing, the superconductor in the first trench, and depositing a barrier material on the sidewall surfaces of the second trench prior to depositing the superconductor in the second trench. The barrier material may be deposited conformally on the sidewall surfaces of the first and second trench. A barrier layer may hence be formed in the trenches (e.g. forming a lining therein) prior to depositing the superconductor. It is to be understood that the barrier material is also formed of a superconductor.

According to embodiments, the first trench may be etched from a first side of the substrate and the second trench may be etched from a second side of the substrate.

The first trench may be formed with a rounded cross-sectional shape (as seen in plane parallel to the substrate). The second trench may be formed with a rounded tubular cross-sectional shape (as seen in a plane parallel to the substrate).

The first and second trenches may be formed coaxially with respect to each other.

The first trench ma be etched to be tapered along a depth direction of the first trench and the second trench may be etched to be tapered along a depth direction of the second trench. The first trench may hence be formed with a width decreasing with increasing depth of the first trench, and the second trench may be formed with a width decreasing with increasing, depth of the second trench.

According to a further aspect there is provided a method for forming a qubit device comprising forming a trench capacitor in accordance with the method set out above, and forming a JJ by depositing a layer stack comprising, two superconductor layers and a tunnel barrier layer in-between.

The method may comprise depositing a superconductor on each of a first and a second side of the substrate, to form a first ground plane on the first side and a second ground plane on the second side.

The JJ may be formed on the first ground plane.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
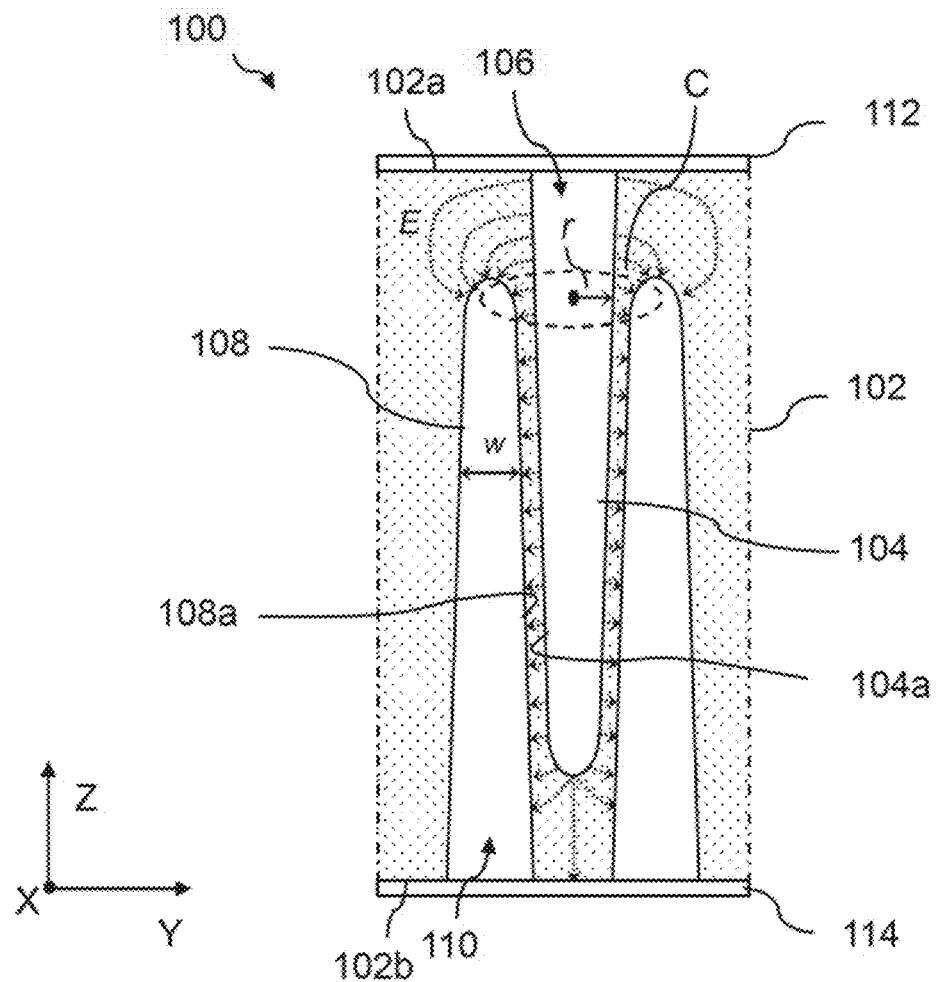
FIG. 1 is a schematic cross-section of a trench capacitor device, according to an example embodiment.

FIG. 1 depicts a schematic cross-section of an embodiment of a trench capacitor device. As will be further disclosed herein, a trench capacitor is suitably combined with a JJ to be used in a superconducting qubit device. However, it is to be noted that a trench capacitor according, to the disclosure is also suitable for use in other types of superconducting electronic circuits which may benefit from an area efficient capacitor exhibiting, to dielectric losses and cross-talk, such as in microwave kinetic inductance detectors, quantum-limited amplifiers, single-flux quanta logic, and cryo-CMOS electronics.

Axes X and Y indicate mutually transverse first and second horizontal directions, respectively, parallel to a main plane of substrate 102, while axis Z indicates a vertical direction, normal to the substrate 102. A plane parallel to the XY plane may in the following be referred to as a radial plane of the trench capacitor device 100.

The trench capacitor device 100 comprises the substrate 102 and a first electrode 104 and a second electrode 108 extending into the substrate 102. The first and second electrodes 104, 108 are configured to form the capacitor electrodes of the trench capacitor device 100, e.g. in use configured to store opposite polarity charge of equal magnitude. The first electrode 104 is circumferentially enclosed by the second electrode 108, as seen in a radial plane, such that an inwardly facing surface 108a of the second electrode 108 faces an outwardly facing surface 104a of the first electrode 104. The first electrode 104 is arranged in a first trench 106 formed in the substrate 102 and the second electrode is arranged in a second trench 110 formed in the substrate 102 such that the first trench 106 is circumferentially enclosed by the second trench 110.

The first electrode 104 and the second electrode 108 are each of a superconductor, such as TiN, Al, Nb, NbTiN, or combinations of two or more thereof. However also other low-temperature or high-temperature superconductors are possible. The first and second electrodes 104, 108 may for example comprise a barrier material of a (first) superconductor forming an outer barrier layer enclosing the superconductor, e.g. ALD TiN, wherein a second superconductor may be subsequently deposited to form the inner volume of the electrodes 104, 108.

According to the present embodiment, the substrate 102 is a crystalline silicon substrate wherein the first and second electrodes 104, 108, i.e. the inwardly and outwardly facing surfaces 104a, 108a thereof, are separated by crystalline silicon. The dielectric of the trench capacitor device 100 is hence formed by crystalline silicon, which is a high-resistance and ultra-low loss dielectric material. According to some embodiments, the substrate 102 may instead be formed of sapphire wherein the electrodes 104, 108 may be separated by sapphire. According to other embodiments, the capacitor dielectric may be formed by an air gap or vacuum, e.g. during fabrication of the trench capacitor device 100 substrate material may be removed (e.g. by etching) in a region between the electrodes 104, 108.

As indicated by the dashed line C, the second electrode 108 has a circular tubular cross-sectional shape. The first electrode 104 has a corresponding circular cross-sectional shape. A "cross-sectional shape" should hereby be understood to indicate a shape as seen in a plane parallel to the main plane of the substrate 102, or equivalently parallel to the XY-plane. The first and second electrodes 104, 108 are coaxially arranged with respect to each other, with the first electrode 104 being radially inside the second electrode 108. Circular cross-sectional shapes and a coaxial configuration may each enable a reduced peak electrical field strength between the electrodes 104, 108 and a reduced stray field. It is however envisaged that, e.g. due to fabrication and/or circuit layout considerations, other electrode configurations may be used such as electrodes 104, 108 having a rounded cross-sectional shape deviating from circular, e.g. an oval shape, or even non-rounded shapes such as a polygonal shape, e.g. with four or more sides. As may be appreciated, the discussion of the cross-sectional shapes of the electrodes 104, 108 apply correspondingly to the first and second trenches 106, 110 accommodating the electrodes 104, 108.

The electrodes 104, 108 may each be formed with a width-to-height ratio less than 1. For example, the first electrode 104 may be formed with a width-to-height ratio of 1:10, e.g. 1 µm wide, 10 µm deep. The second electrode 108 due to its greater radial dimension may have a greater width-to-height ratio, e.g. 5 µm width (outer width), 10 µm deep. A distance between the inner and outer electrode surfaces 104a, 108a may be on the order of 1 µm, e.g. a distance in a range of 0.2-10 µm.

By the arrangement of the second electrode 108 enclosing the first electrode 104 in a radial plane, an electrical field E (schematically indicated by dotted arrows in FIG. 1) may be localized between the electrodes 104, 108, i.e. within the inner space enclosed by the second electrode 108. As indicated in FIG. 1, stray electric field lines outside the trench capacitor device 100 may hence be reduced.

Still with reference to FIG. 1, the first trench 106 extends into the substrate 102 from a first substrate side 102a in a direction towards a second substrate side 102b (i.e. against the Z direction). The second trench 110 extends into the substrate 102 from the second side 102b towards the first side 102a (along the Z direction). This applies correspondingly to the first electrode 104 and the second electrode 108 arranged respectively in the first trench 106 and second trench 110.

The first electrode 104 and first trench 106 each have a radial dimension or width dimension r (as seen in a radial plane) which decreases along a direction from the first side 102a towards the second side 102b (i.e. against the Z direction). That is, the radial dimension r of the first electrode/trench 104/106 decreases with increasing depth in the substrate 102 (increasing depth as seen from the first side 102a).

The second electrode 108 and the second trench 110 correspondingly each have a wall thickness w (as seen in a radial plane) which decreases along a direction from the second side 102b towards the first side 102a (i.e. along the Z direction). That is, the wall thickness w of the second electrode/trench 108/110 decreases with increasing depth (increasing depth as seen from the second side 102b).

As indicated in FIG. 1, a radial dimension of an inner space enclosed by the second electrode/trench 108/110 as seen in a radial plane) may thereby increase along the Z direction to accommodate the increasing, radial dimension r of the first electrode/trench 104/106 along the Z direction.

The dimensions w and r may as shown vary along the Z direction such that the first electrode/trench 104/106 and second electrode/trench 108/110 are separated by a dielectric (e.g. crystalline silicon) of, for example, uniform, or at least substantially uniform, thickness, e.g. a thickness in a range from 0.2-10 µm, for example, with a variation of at most 1%.

The illustrated electrode and trench configuration may be obtained by forming the first trench 106 and the second trenches 110 by etching from the first side 102a and the second side 102b, respectively. E.g. one trench of the trenches may be etched first from one side, and the substrate 102 may then be flipped wherein the other trench may be etched from the opposite side of the substrate 102. Etched trenches may typically be tapered with increasing etch depth. State of the art trench etching techniques may allow a tapering, angle to be precisely controlled (within some angular interval dependent e.g. on trench depth, substrate material and etching process). Accordingly, a tapering angle of the sidewall surface of the first trench 106 may be met with a corresponding tapering angle of the (inner) sidewall surface of the second trench 110 from the opposite side.

The illustrated "opposite-sided" electrode and trench configuration can enable a reduced footprint of the first and second electrodes 104, 108. By way of example, this configuration can enable a footprint reduction of about 30% for a trench capacitor with an aspect ratio of 1:10 (width to height), compared to a "same-sided" configuration of the electrodes and trenches 104, 106 and 108, 110.

It is however envisaged that e.g. fabrication and/or circuit layout considerations in some instances, may motivate a same-sided configuration of the electrodes 104, 108 and trenches 106, 110. According to some embodiments with a same-sided electrode, the first trench 106 and the second trench 110 may both be etched from the first side 102a of the substrate 102. As may be appreciated, tapering of the trenches 106, 110 may in this ease result in a gradually increasing thickness of dielectric between the first and second trenches 106, 110. Such a dielectric thickness variation may be minimized (or even avoided, at least for smaller trench depths) by carefully controlling the trench etch. According to other embodiments, the first electrode/trench 104/106 may be formed with a cylindrical cross-sectional shape (i.e. with a uniform, or at least substantially uniform, radial dimension r along the Z direction). Correspondingly, the second electrode/trench 108/110 may be formed with a hollow cylindrical cross-sectional shape with a uniform width dimension w along the Z direction). This may be achieved by controlling the trench etching to minimize a tapering angle. This may be more readily obtained for shallower trenches, and hence for trench capacitors of greater aspect ratios.

The trench capacitor device 100 as illustrated further comprises a first superconductor layer 112 arranged on the first substrate side 102a and a second superconductor layer 114 arranged on the second substrate side 102b. The first electrode 104 abuts the first superconductor layer 112 and extends therefrom towards the second side 102b. The second electrode 108 abuts the second superconductor layer 114 and extends therefrom towards the first side 102a. The electrodes 104, 108 may in turn be electrically connected to other any circuit elements via the superconductor layers 112, 114. One or more of the superconductor layers 112, 114 may also be arranged as ground planes of the trench capacitor device.

A method for forming the trench capacitor device 100 in FIG. 1 may comprise etching first and second trenches 106, 110 in the substrate 102 from the first side 102a and the second side 102b, respectively. "First" and "second" should hereby not be construed to imply any particular order of formation but are merely used as labels for the sides 102a, 102b/trenches 104, 108. An etching process like reactive ion etching (RIE) or derivatives thereof, such as the Bosch-method, may be used to etch trenches in the crystalline silicon substrate 102. As may be appreciated, the trenches 106, 110 may also be etched from a same side of the substrate 102, e.g. the first side 102a or the second side 102b if a same-sided electrode configuration is desired. As may be further appreciated, a different substrate material (e.g. MgO) may require other types of trench formation techniques.

The first and second electrodes 104, 108 may subsequently be formed by depositing one or more superconductors in the first trench 106 and the second trench 110, respectively (e.g. more than one superconductor the first forming a barrier layer in the trench). The superconductor (e.g. any of the aforementioned materials) may be deposited using an suitable conventional deposition technique, like physical vapor deposition (PVD), chemical vapor deposition (CVD), atomic layer deposition (ALD) or evaporation-based techniques. The deposition in each trench 106, 110 may be performed after both trenches 106, 110 have been formed, or interleaved with the trench formation, e.g. after forming the first trench 106 depositing material therein, and then forming the se and trench 110 and depositing material therein.

The deposition of the superconductor in the first trench 106 and the second trench 110 may result in forming of a superconductor layer on the first side 102a and the second side 102b respectively. These superconductor layers 112, 114 may be used to define the ground planes. A patterning step may be applied to one or both superconductor layers 112, 114, e.g. to create discontinuities in the ground planes and form conductive traces and other peripheral circuitry.

Although reference in the above is made to only one trench capacitor device 100, it is to be understood that a plurality of such devices 100 may be fabricated in parallel, e.g. by simultaneously etching plural pairs of first and second trenches 106, 110 in the substrate 102 and forming pairs of first and second electrodes 104, 108 therein.

Figure 2:
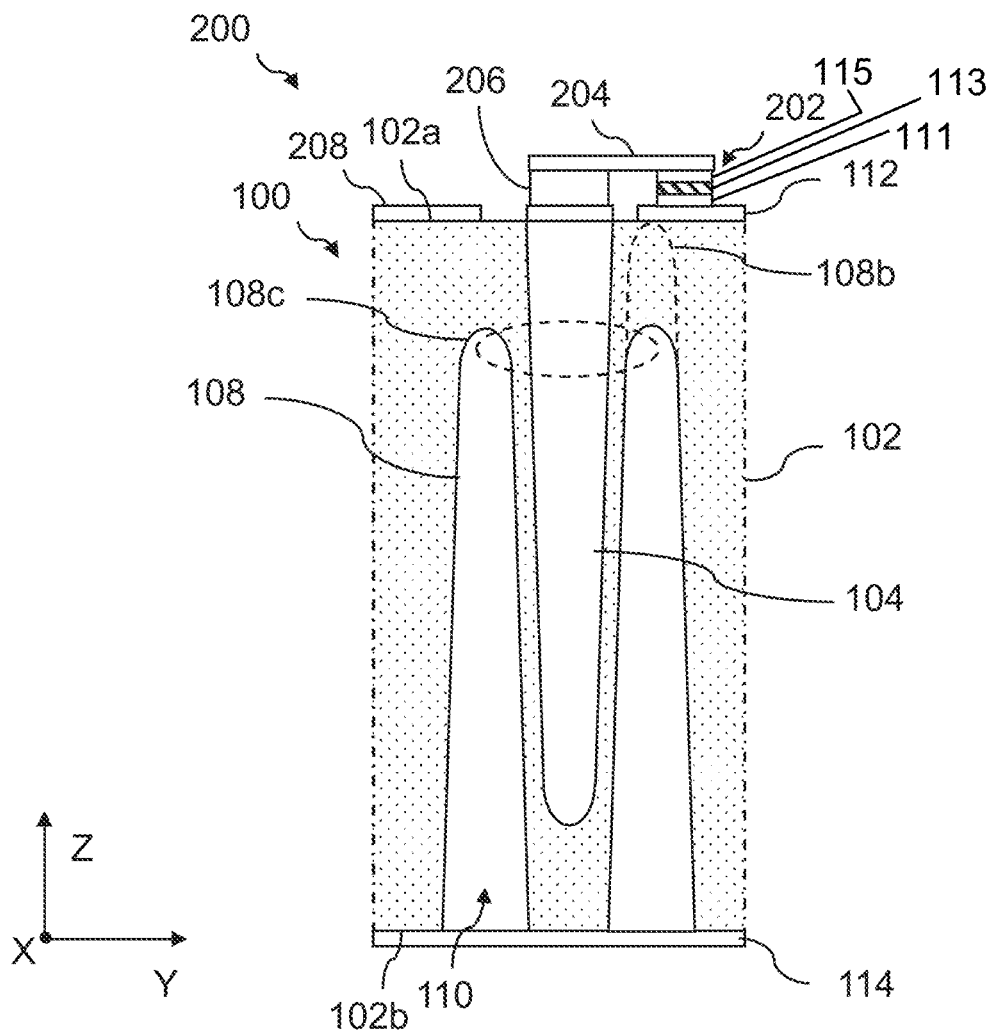
FIG. 2 is a schematic cross-section of a superconducting qubit device, according to an example embodiment.

FIG. 2 depicts in a schematic cross-section an embodiment of a superconducting qubit device 200. The qubit device 200 comprises the trench capacitor device 100 and a JJ 202.

The illustrated JJ 202 is formed as a three or four-layer stack comprising a lower electrode layer 111, an insulating tunneling barrier layer 113 (e.g. a 1-2 nm thick oxide layer), and an upper electrode layer 115. By way of example, the JJ 202 may comprise a stack of Al—$AlO_x$—Al, NbN—AlN—NbN, $(ReTi)_{12}$—$AlO_x$—Al, or Nb-aSi—Nb. Alternative configurations of a JJ include four-layer stacks such as Nb—Al—$AlO_x$—Nb, or a JJ in a SQUID-configuration.

The JJ 202 is connected between the first electrode 104 and the second electrode 108 such that the JJ 202, under proper operating conditions, may function as a non-linear inductor in parallel to the trench capacitor device 100.

In the illustrated embodiment, the first superconductor layer 112 forms a first ground plane on the first substrate side 102a and the superconductor layer 114 forms a second ground plane on h second substrate side 102b. The lower electrode layer of the JJ 202 abuts (and is hence connected to) the first superconductor layer 112 while the upper electrode layer of the JJ 202 is connected to the first electrode 104 of the trench capacitor device 100. The upper electrode layer and the first electrode 104 is connected by a horizontal interconnect 204 (e.g. a conductive layer or line) and a vertical interconnect 206 (e.g. a contact or via). However, other was of facilitating the interconnection between the upper electrode layer and the first electrode 104 are also possible. According to other embodiments, the interconnection may instead be provided by horizontally extending the upper electrode layer to abut a portion of the first electrode 104 formed to protrude above the first substrate side 102a.

To complete the connection between the trench capacitor device 100 and the JJ 202, the first superconductor layer 112 may be connected to the second superconductor layer 114. In the illustrated embodiment, this is achieved by the second electrode 108 comprising a portion 108b extending completely through the substrate 102 to abut the first superconductor layer 112, i.e. from underneath. The portion 108b forms a distal end or tip of the second electrode 108. According to other embodiments, the first and second superconductor layers 112, 114 may additionally or alternatively be interconnected by means of a vertical interconnect structure, e.g. one or more through-substrate vial provided adjacent the electrodes 104, 108 or in a peripheral region of the substrate 102.

According to alternative embodiments, a qubit device may comprise two JJs 202 connected in parallel between the capacitor electrodes 104, 108.

The qubit device 200 further comprises a feedline 208 arranged on the first substrate side 102a and configured to be capacitively coupled to at least one of the first and the second electrodes 104, 108. The feedline 208 extends to overlie a second portion 108c of the second electrode 108 as seen in a radial plane. In other words, the feedline 208 may extend to horizontally overlap the second portion 108c. The feedline 208 may however in other embodiments terminate at a greater distance from the first electrode 104 such that no overlap with the second electrode 108 is formed. The feedline 208 may be coupled to a resonator, e.g. forming part of peripheral circuitry formed on the substrate 102.

Figure 3:
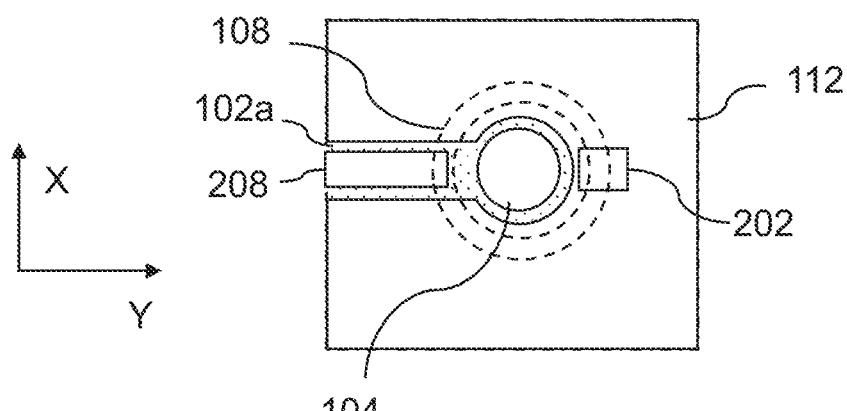
FIG. 3 is a schematic top-down view of the superconducting qubit device of FIG. 2, according to an example embodiment.

FIG. 3 is schematic top-down view of the qubit device 200, with elements 204 and 206 omitted to allow at unobstructed view of underlying structures. FIG. 3 also indicates in dashed lines an outline 202 of the second electrode 408 at the vertical level of the dashed line circle in FIG. 2.

The first superconductor layer 112 is formed to be interrupted/discontinuous in a region to create space for the feedline 208 and the first electrode 104. During fabrication, the discontinuity, and also the feedline 208, may be formed in a patterning step comprising etching away the superconductor layer in regions where no ground plane is to be present. As may be appreciated from FIG. 3, the tip portion 108b of the second electrode 108 may extend completely or partially along the circumferential edge of the superconductor layer 112.

Figure 4:
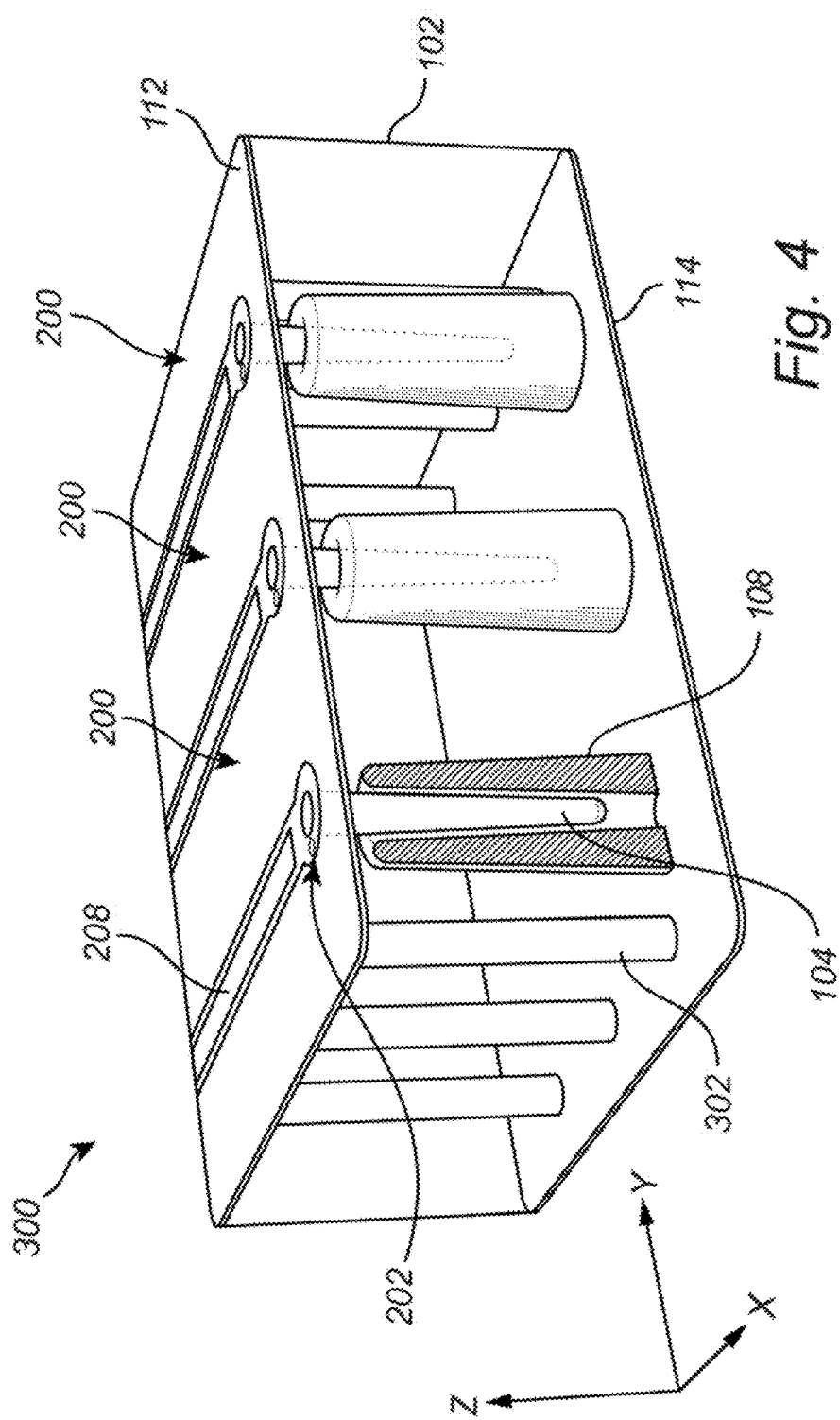
FIG. 4 is a schematic perspective view of an array of qubit devices, according to an example embodiment.

FIG. 4 is a schematic perspective view of an array 300 of qubit devices 200. Each qubit device 200 comprises a trench capacitor device 100 and a JJ 202 (or more than one JJ). A feedline 208 is configured to be capacitively coupled to each trench capacitor device 100. A first superconductor layer 112 and a second superconductor layer 114 are formed on the first side 102a and the second side 102b of the substrate 102.

The superconductor layers 112, 114 are interconnected by a number of vertical through-substrate vias 302, regularly distributed in the array 300.

The feedline 208 may connect each qubit device 200 to a readout resonator, e.g. comprising a capacitor and an inductor. Qubit devices 200 may be interconnected by qubit couplers, e.g. formed by resonators or additional qubit devices configured as couplers.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A trench capacitor device comprising:
  a substrate;
  a first electrode comprising a superconductor and extending into the substrate, wherein the first electrode is arranged in a first trench extending into the substrate from a first side towards a second side of the substrate; and
  a second electrode comprising a superconductor and extending into the substrate, the first electrode being circumferentially enclosed by the second electrode such that an inwardly facing surface of the second electrode faces an outwardly facing surface of the first electrode, wherein the second electrode is arranged in a second trench extending into the substrate from the second side towards the first side.

2. The trench capacitor device according to claim 1, wherein the inwardly facing surface and the outwardly facing surface are separated by a dielectric material of the substrate.

3. The trench capacitor device according to claim 1, wherein the first electrode and the second electrode are separated by crystalline silicon.

4. The trench capacitor device according to claim 1, wherein the inwardly facing surface and the outwardly facing surface are separated by an air gap.

5. The trench capacitor device according to claim 1, wherein the inwardly facing surface and the outwardly facing surface are separated by a vacuum.

6. The trench capacitor device according to claim 1, wherein the first electrode has a rounded cross-sectional shape.

7. The trench capacitor device according to claim 1, wherein the second electrode has a rounded tubular cross-sectional shape.

8. The trench capacitor device according to claim 1, wherein the first electrode and the second electrode are coaxially arranged.

9. The trench capacitor device according to claim 1, wherein the first electrode has a decreasing radial dimension along a first direction from a first side of the substrate towards a second side of the substrate.

10. The trench capacitor device according to claim 9, wherein the second electrode has a decreasing wall thickness along a second direction from the second side towards the first side.

11. The trench capacitor device according to claim 1, further comprising:
- a first ground plane arranged on a first side of the substrate;
- a second ground plane arranged on a second side of the substrate opposite the first side;
- a first Josephson junction connected between the first electrode and the second electrode and arranged on the first ground plane;
- a third electrode comprising a superconductor, wherein the third electrode is in contact with the first ground plane and extends into the substrate;
- a fourth electrode comprising a superconductor, wherein the fourth electrode is in contact with the second ground plane and extends into the substrate, the third electrode being circumferentially enclosed by the fourth electrode such that an inwardly facing surface of the fourth electrode faces an outwardly facing surface of the third electrode; and
- a second Josephson junction connected between the third electrode and the fourth electrode and arranged on the first ground plane.

12. A superconducting qubit device comprising:
- a trench capacitor device comprising:
  - a substrate;
  - a first electrode comprising a superconductor and extending into the substrate; and
  - a second electrode comprising a superconductor and extending into the substrate, the first electrode being circumferentially enclosed by the second electrode such that an inwardly facing surface of the second electrode faces an outwardly facing surface of the first electrode; and
- a Josephson junction connected between the first electrode and the second electrode of the trench capacitor device.

13. The superconducting qubit device according to claim 12, further comprising a first ground plane arranged on a first side of the substrate and a second ground plane arranged on a second side, wherein a lower electrode layer of the Josephson junction abuts the first ground plane, the second electrode abuts the second ground plane, and the first electrode is connected to an upper electrode layer of the Josephson junction.

14. The superconducting qubit device according to claim 13, wherein a portion of the second electrode extends completely through the substrate to abut the first ground plane.

15. The superconducting qubit device according to claim 13, further comprising a superconductor via arranged to extend through the substrate to interconnect the first ground plane and the second ground plane.

16. The superconducting qubit device according to claim 13, further comprising a feedline arranged on the first side and capacitively coupled to the trench capacitor device.

17. The superconducting qubit device of claim 12, wherein the first electrode is arranged in a first trench extending into the substrate from a first side towards a second side of the substrate, and wherein the second electrode is arranged in a second trench extending into the substrate from the second side towards the first side.

* * * * *